United States Patent [19]
Goto

[11] Patent Number: 5,523,185
[45] Date of Patent: Jun. 4, 1996

[54] METHOD FOR MANUFACTURING STENCIL MASK

[75] Inventor: Takashi Goto, Ushiku, Japan

[73] Assignee: Sanyo Electric Co., Ltd., Osaka, Japan

[21] Appl. No.: 340,116

[22] Filed: Nov. 15, 1994

[30] Foreign Application Priority Data

Nov. 15, 1993 [JP] Japan ................................ 5-285034

[51] Int. Cl.$^6$ ................................................. G03F 9/00
[52] U.S. Cl. ........................ 430/5; 430/308; 219/69.17; 219/69.2
[58] Field of Search ........................... 430/5, 308, 313, 430/314, 315, 323, 324; 219/69.17, 69.2; 156/644, 657, 662

[56] References Cited

U.S. PATENT DOCUMENTS 5,401,932  3/1995  Hashimoto et al. ..................... 430/5

Primary Examiner—S. Rosasco
Attorney, Agent, or Firm—Loeb and Loeb

[57] ABSTRACT

A method for manufacturing a stencil mask in provided, in which precise patterning and a sufficient thickness of the absorber film are ensured, and manufacturing steps are simplified. Temporary holes 1h are formed on the substrate 1 based on the precise mask pattern of the intermediate film 2. The absorber film 3 is formed on the intermediate film 2, while an extra portion of the absorber film is deposited and stored in the temporary holes 1h. The absorber film 3 is made sufficiently thick while maintaining the precise patterning of the intermediate film 2. A window 6 is formed from the rear surface of the substrate penetrating through the substrate, through which beams pass. The temporary holes 1h and the extra portion of the absorber film are naturally removed during the forming of the window 6.

24 Claims, 8 Drawing Sheets

METHOD FOR MANUFACTURING STENCIL MASK

BACKGROUND OF THE INVENTION

1. Field of the Invention

This invention generally relates to a method for manufacturing a stencil mask for patterning, used for manufacture of semi-conductor devices, and more particularly to a method for manufacturing a patterning stencil mask used for a beam process, including photochemical etching or deposition, where beams are introduced for enhancing a reaction of photons, electrons, ions, radicals, and so on, to selectively control the reaction on a particular area of a surface of an object onto which beams are irradiated.

2. Description of the Related Art

In etching or deposition techniques for use in the manufacture of semi-conductor devices, a photochemical reaction process has attracted a great deal of attention. Such a photochemical reaction process is disclosed, for example, in HYOMEN KAGAKU, Vol. 5, No. 4, pp.435, in which a reactive gas and beams (photons) are introduced into a reaction chamber and photons are selectively irradiated onto a certain area of the object (e.g. a surface of a semiconductor substrate) to enhance a reaction. Particularly in photochemical reaction etching, a fluorine series of etching gas is used as a reactive gas, and the reaction caused by this etching gas is enhanced by photons.

In such a photochemical reaction process, no intimate contact type of photoresist mask is required although such a mask is indispensable in photoresist lithography. In other words, the object is directly etched without a photoresist mask, which results in the remarkable advantage of dispensing with a process for forming photoresist mask.

Because of this advantage, the photochemical reaction process has been rated highly, and therefore a stencil mask used for this process is also in great demand, especially in the field of manufacturing of semiconductor devices.

FIG. 10(d) of the accompanying drawings shows a completed prior art stencil mask which is disclosed in Japan Patent Application Serial Number H5-264948. The stencil mask comprises a mask substrate 20, an absorber film 21 formed on the surface of the substrate, and a rear reinforcement film 23 formed on the rear surface of the substrate. A pattern 22 is formed on the absorber film 21. The absorber film 21 has a self-supporting function, in addition to an absorptive or reflective characteristic, for reinforcing a tension (internal stress) of the film itself and preventing itself from being peeled off or loosened.

A window 24 is formed penetrating through the mask substrate to communicate with the pattern 22, through which photons pass. The rear reinforcement film 23 is formed on the rear surface of the mask substrate 20 so as to offset the internal stress generated by the absorber film 21, thereby keeping the mask substrate 20 from being bent. The rear reinforcement film 23 is made of the same material as the absorber film 21, and has the same thickness. However, if the internal stress of the absorber film 21 is very small so that the mask substrate is not warped, the rear reinforcement film 23 is not necessarily required. The rear reinforcement film 23 also serves as an etching mask for forming the window 24 by a back etching technique.

FIGS. 10(a)–10(d) show processes for making the prior art stencil mask for the photochemical reaction process. The conventional method comprises steps of forming an absorber film 21 having a predetermined pattern on the surface of the mask substrate, and forming a window 24 on the mask substrate through which photons pass.

For these processes, a lift-off technique is used for forming the absorber film 21. In a first step, as shown in FIG. 10(a), a photoresist film 25 is formed on a part of the mask substrate 20, which has an inverted mask pattern to the pattern 22, by using photoresist lithography. Then, in a second step shown in FIG. 10(b), an absorber film 21 is deposited on the photoresist film 25 and the exposed surface of the substrate 20 around the photoresist film. In a third step as shown in FIG. 10(c), the photoresist film 25 is removed together with the extra absorber film covering the photoresist film 25 (i.e. lift-off process). As a result, the absorber film 21 remains on the mask substrate with a predetermined pattern. In the next step, the rear reinforcement film 23 is formed on the rear surface of the mask substrate, having an opening corresponding to the window 24. Finally, a window 24 is formed penetrating through the mask substrate with a back etching technique, by using the rear reinforcement film 23 as an etching mask, and the stencil mask is completed.

The thus manufactured stencil mask has an advantage that the mask structure is simplified since the absorber film has a self-supporting function, compared with the conventional stencil mask which is manufactured by separately forming a self-supportive film and an absorber film.

However, the above mentioned stencil mask manufacturing method using a lift-off technique has some problems.

Firstly, the thickness of the absorber film 21 is limited to the thickness t1 of the photoresist film 25. In other words, the reversed-patterned photoresist film 25 must be sufficiently thick to project from the top surface of the absorber film 21 so as to be lifted off. Meanwhile, the absorber film 21 must have sufficient thickness to provide a self-supporting function in addition to the absorptive or reflective function, which makes the thickness t1 of the photoresist film 25 greater. If sufficient thickness is not ensured in the photoresist film 25, the thickness of the absorber film 21 is naturally reduced, which causes either of the absorptive (or reflective) function or the self-supporting function to be lowered. Also, mechanical strength of the stencil mask is reduced and the effective area for forming a pattern 22 is decreased, which hinders the realization of a highly integrated circuit for a semiconductor device.

Secondly, when the thickness t1 of the photoresist film 25 is simply increased to ensure sufficient thickness of the absorber film 21, the width p1 of the mask pattern (see FIG. 10(a)) must be also increased in the photoresist film 25, which results in a reduced precision in forming mask pattern. More particularly, when the photoresist film 25 is exposed (or patterned) with the FIB (Focused Ion Beam) method, as the thickness t1 of the photoresist film 25 increases, the ion-dose amount and the exposing energy must be increased while blooming of the radiation beam profile and decrease of focal depth arise. The photoresist film 25 having a less accurate mask pattern leads to a degraded patterning accuracy in the absorber film 21 formed by a lift-off technique. For this reason, it becomes difficult to form a precise pattern 22 on the stencil mask.

Although these problems has been described in connection with a stencil mask for photo chemical reaction, these are common problems for the general stencil mask used for the manufacture of semi-conductor devices.

SUMMARY OF THE INVENTION

This invention was conceived to overcome the foregoing disadvantage of the prior art. Accordingly, it is an objective of the invention to provide a method for manufacturing a stencil mask used for a beam process including photochemical etching or deposition, said beam including photons, electrons, ions, radicals, etc., in which both a sufficient thickness and precise patterning are ensured in the absorber film to provide a mechanical strength and functionality, while simplifying the manufacturing processes. Also in this invention, the thickness of the resist film is reduced compared with the conventional method in order to achieve minute and precise patterning and reduced manufacturing cost.

In one aspect of the invention, a stencil mask is manufactured according to the following steps. (1) A supplemental film having a predetermined mask pattern is formed on a surface of the mask substrate. (2) Temporary holes are formed on the mask substrate based on the mask pattern by removing a portion of the substrate from its exposed surface toward the rear Surface thereof. (3) The supplemental film is removed from the mask substrate. (4) A main film having at least either absorptive or reflective characteristics for beams (including photons, electrons, ions, radicals, etc) is formed on the substrate. An extra portion of the main film material is deposited in the temporary holes. (5) A window is formed penetrating through the substrate at an area corresponding to the mask pattern by etching the substrate from its rear surface until communicating with the mask pattern, through which the beams pass. Said extra portion of the main film material deposited in the temporary holes is removed during the forming of the window.

In this method, temporary holes are formed on the substrate corresponding to the mask pattern of the supplemental film for the purpose of temporarily storing an extra portion of the absorber film. Since the supplemental film serves only as an etching mask for forming temporary holes, the thickness of the supplemental film can be made very small, and therefore, high accuracy for patterning is achieved. For example, when using the FIB technique for the patterning of the supplemental film, the ion-dose amount and exposing energy are reduced while the radiation beam profile and focal depth are improved. The precise mask pattern of the supplemental film is reflected to effect the patterning of the mask substrate, and then, of the primary film. The main film serves as an absorber film having an absorptive or reflective function for beams, and has a sufficient thickness because a self-supporting function is provided to this film. During the forming of the main film, an extra portion of the main film material is deposited into the holes, and is temporarily stored therein. The temporary holes are destroyed during the forming of the window, and the extra portion of the main film deposited there is also removed so that the window penetrating through the mask substrate communicates with the mask pattern.

As has been described, the supplemental film serves only as an etching mask for patterning the mask substrate, and therefore, material having a lower etched rate is selected for the supplemental film compared with the substrate (under the same etching conditions) so as to ensure a sufficient ratio of etched rates (i.e. selectivity). Also etching gas or liquid is selected so that the etching selectivity between the supplemental film and the substrate is maintained. The sufficient etching selectivity allows the thickness of the supplemental film to be small, which results in the precise patterning.

The mask pattern formed in the supplemental film becomes a reference for the final pattern of the main film which is finally self-aligned to the mask pattern. Because of the small thickness of the supplemental film, the time required for forming the supplemental film having the reference mask pattern is very short. When using the FIB technique, the exposure time is shortened in addition to the reduced ion-dose amount and exposing energy.

In another aspect, removal of the supplemental film is carried out simultaneously with forming of the temporary holes on the substrate. That is, as the forming of the temporary holes is advanced, the supplemental film is removed. By this method, besides the manufacturing process is simplified, the supplemental film can be made thinner because it exists only until the temporary holes are completed. Consequently, more precise patterning is achieved.

In still another aspect of the invention, removal of the supplemental film is omitted. More particularly, the supplemental film is left as it is, and is used as a part of the absorber film or as a film having other characteristics. This means that supplemental film constructs a part of the stencil mask, and the total manufacturing processes are further simplified. Also, as has been described above, the reference pattern of the supplemental film is precisely formed because of the small thickness, and such precise patterning is transferred to the mask substrate and then to the main film. The absorber film can be formed sufficiently thick while maintaining a self-aligning property because an extra portion is deposited in the temporary holes which is to be removed during the forming of the window.

In these embodiments, the supplemental film is thinner than the main film to maintain the precise patterning of the supplemental film while shortening the exposure time.

Said supplemental film forming process may comprise steps of (i) forming a resist film over the surface of the mask substrate, (ii) exposing the resist film with a predetermined mask pattern, (iii) developing the resist film, and (iv) rinsing the developed resist film. In this case, said supplemental film is a resist film having a predetermined mask pattern. By successively carrying out the coating, baking, exposure and development of the resist film, the resist film itself can be an etching mask for forming temporary holes. The resist film serves only as an etching mask, which thickness is relatively reduced. Also the mask pattern of the resist film is directly copied to the mask substrate, and the precision of the patterning is maintained. Furthermore, by using the resist as a supplemental film, the manufacturing processes of a stencil mask is facilitated compared with a photolithographic process or an etching technique.

In another embodiment, said supplemental film forming process may comprise steps of (i) forming a resist film having an inverted mask pattern on the surface of the mask substrate, (ii) depositing a supplemental film onto the resist film and in the opening of the inverted mask pattern (i.e. on the exposed portion of the mask substrate), and (iii) removing the resist film together with the supplemental film deposited thereon. In this case, the mask pattern of the supplemental film is formed by a lift-off method. Since the thickness of the supplemental film should be small, thickness of the resist film having an inverted pattern naturally becomes small, and therefore, the exposure time is shortened.

In still another embodiment, the supplemental film forming process may comprise steps of forming a supplemental film over the surface of the mask substrate, forming a resist film over the supplemental film, exposing the resist film with a predetermined mask pattern, developing the resist film to form an etching mask, and etching the supplemental film based on the etching mask to form a predetermined pattern in the supplemental film. In this embodiment, the supplemental film is formed by photolithographic process and etching. As has been repeated stated, since both the resist film and the supplemental film serve only as an etching mask, the thickness of these film is small and precise patterning is possible. Also, the exposure time for forming a mask pattern on the photoresist film is shortened.

In another aspect of the invention, the following steps are carried out for manufacturing a stencil mask. (1) Temporary holes are formed on the substrate with a predetermined pattern by irradiating beams for etching onto desired areas of the surface of the mask substrate to remove a portion of the mask substrate from its surface toward the rear surface. (2) A main film having at least either absorptive or reflective characteristics is deposited onto the surface of the mask substrate and in the temporary holes. (3) A window is formed penetrating the substrate, through which the beams pass, by etching the substrate from its rear surface at an area corresponding to the temporary holes until communicating with the pattern of the main film. The temporary holes and the extra portion of the main film deposited into the holes are also removed during the forming of the window.

In this embodiment, etching beams are directly irradiated onto predetermined areas of the mask substrate to directly form the temporary holes. The diameter of the beam is faithfully copied to the patterns of the temporary holes. The very accurate mask patterning is transferred to the main film when depositing the main film. Further, since the temporary holes are directly formed by etching beams, a process for forming an etching mask by a photolithographic process is omitted. As a result, total manufacturing processes are simplified and manufacturing time is shortened.

The temporary holes forming process may include isotropic etching. In this case, etching is carried out from the surface of the mask substrate to both the depth and lateral directions based on the mask pattern. The lateral-direction etching (side etching) allows the temporary holes to have a sufficient capacity for storing an extra main film, whereby the main film can be deposited up to a sufficient thickness. The isotropic etching helps to reduce the etching amount for the temporary holes. If the etching amount is reduced, the thickness of the supplemental film can be made thinner. By forming the temporary holes by the isotropic etching, the back-etching amount for forming the window is also reduced, which can shorten the time taken for the window forming process. Furthermore, since the side wall of the holes is hollowed under the supplemental film, the extra portion of the absorber film deposited in the hole is prevented from attaching to the side wall of the holes. As a result, the absorber film formed on the supplemental film is reliably separated from the extra portion of the absorber film deposited in the holes, and a sufficiently thick absorber film is realized.

The temporary holes forming process may also include anisotropic etching. In this case, etching is carried out from the surface of the mask substrate only in the depth direction and side etching scarcely occurs. Since the side wall of the temporary holes is scarcely eroded by etching beyond the edge of the mask pattern of the supplemental film, an overhanging portion is not generated at the pattern edge of the supplemental film. The mask substrate positioned just under the edge portion of the mask pattern of the supplemental film can support the mechanical strength of the supplemental film, thereby preventing a deformation of the edge portion. Consequently, more minute and detailed patterning can be realized.

In further aspect of the invention, a step for forming a rear reinforcement film on the rear surface of the mask substrate may be inserted between the supplemental film forming step and the window forming step, or between the temporary holes forming step and the window forming step, for the purpose of offsetting the inner stress of the main film. The rear reinforcement film can prevent the warp (bending) of the mask substrate. As a result, the surface of the main film is kept being flat and even, which enhances the accuracy of mask patterning. The rear reinforcement film also enhances the mechanical strength of the mask substrate itself, thereby improving a life of the stencil mask.

A step for forming an intermediate film on the substrate may be inserted after the supplemental film removing step and before the main film forming step. The adhesiveness between the intermediate film and the main film, and between the intermediate film and the mask substrate is greater than that between the main film and the mask substrate. Thus, the intermediate film enhances the adhesion of the main film and mask substrate, and thereby prevents the main film from being loosened or peeled off as well as maintaining the flatness of the surface of the main film.

A step for forming an intermediate film on the substrate may be inserted before the supplemental film forming step. The adhesiveness between the intermediate film and the main film, and between the intermediate film and the mask substrate is greater than that between the main film and the mask substrate. The same effect as the above is obtained. Further, the supplemental film may be used as an intermediate film. In that case, the supplemental film forming step includes the intermediate film forming step, and the supplemental film has a sufficient adhesiveness.

Sequential steps of (i) forming an intermediate film on the rear surface of the mask substrate and (ii) forming a rear reinforcement film on the intermediate film, may be inserted between the main film forming step and the window forming step, or between the holes forming step and the window forming step. The intermediate film has a greater adhesiveness than that of the mask substrate and the reinforcement film. The reinforcement film supports the mask substrate and can offset the inner stress of the main film.

BRIEF DESCRIPTION OF THE INVENTION

FIGS. 1(a), (b), (c), (d), (e), (f) and (g) show each of the processes for manufacturing the stencil mask according to the first embodiment of the invention.

FIGS. 2(a), (b), (c) and (d) show processes for manufacturing a stencil mask according to the second embodiment of the invention.

FIGS. 3(a), (b), (c) and (d) show each of the processes of manufacturing the stencil mask according to the third embodiment of the invention.

FIGS. 4(a) and 4(b) show processes of manufacturing the stencil mask according to the fourth embodiment of the invention.

FIGS. 5(a), (b), (c), (d) and (e) show each of the processes of manufacturing the stencil mask according to the fifth embodiment of the invention.

FIGS. 6(a), (b), (c), (d) and (e) show processes of manufacturing the stencil mask according to the sixth embodiment of the invention.

Figure 10:
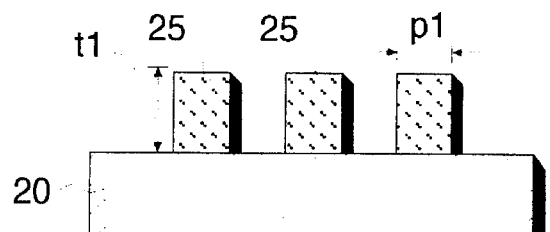
Figure 10:
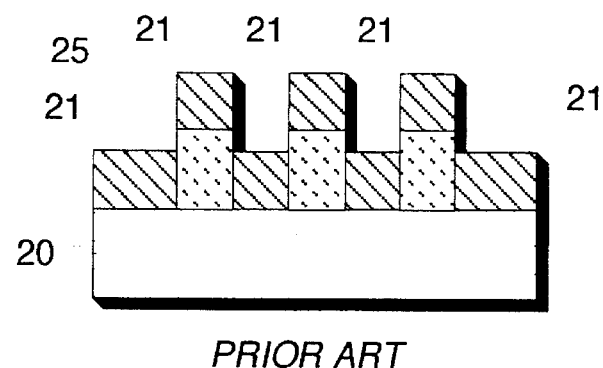
Figure 10:
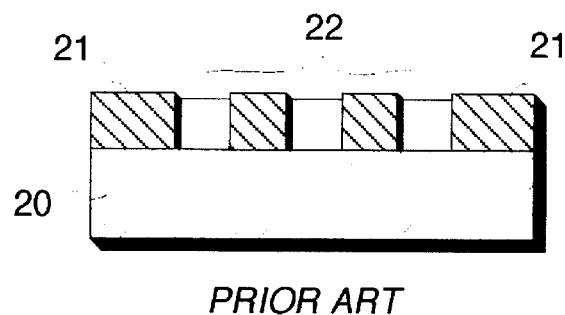
Figure 10:
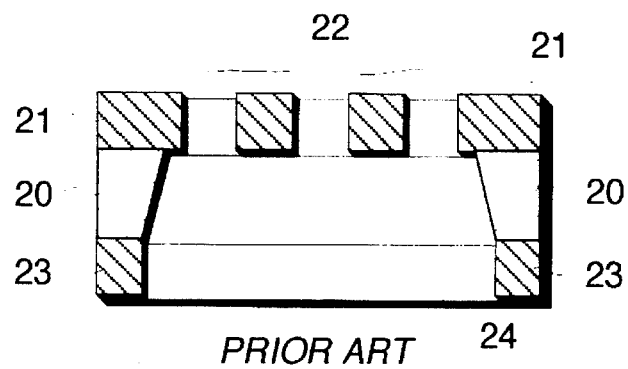

FIGS. 10(a), (b), (c) and (d) show each of the processes of a conventional method for manufacturing a stencil mask.

DESCRIPTION OF THE PREFERRED EMBODIMENT

First Embodiment

This invention will be described in connection with the stencil mask used for photochemical reaction processing.

Figure 1:
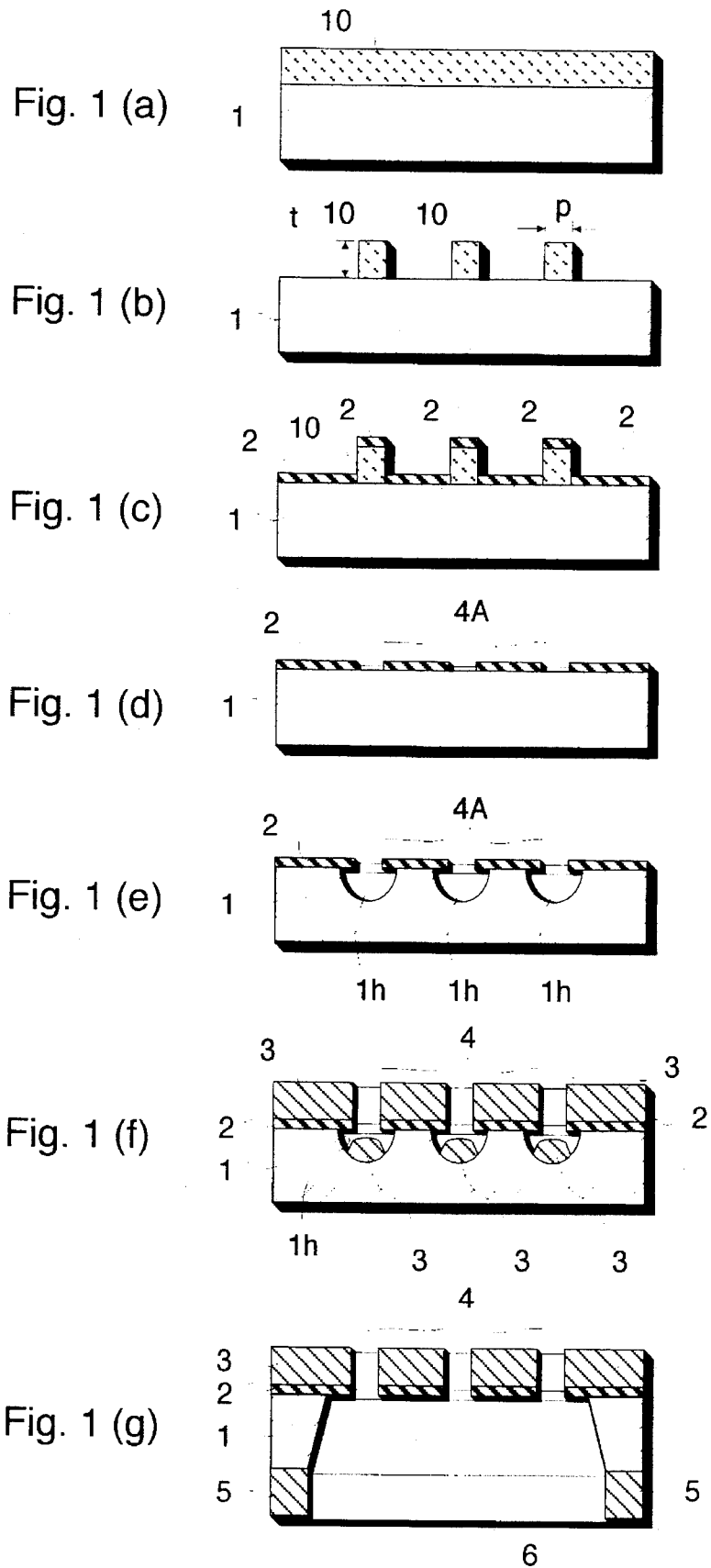

A completed stencil mask shown in FIG. 1(g) comprises a mask substrate 1, an intermediate film 2, an absorber film 3, a mask pattern 4, a rear reinforcement film 5 and a window 6. The window 6 extends from the rear surface of the mask substrate 1 penetrating through the substrate and communicates with the mask pattern 4, through which the beams pass. In this embodiment, the window 6 is formed in the center of the substrate 1. The "surface of the substrate" is defined in the invention as a surface which is opposed and adhered to a surface of a piece such as a semiconductor wafer. In the completed stencil mask, the openings of the mask pattern formed in the main film are within the window area. On the rear surface of the substrate is a rear reinforcement film.

The materials for the mask substrate 1, the intermediate film 2, the absorber film 3, and the rear reinforcement film 5 can be selected depending on the usage of the stencil mask from among the groups described below. Of course, such materials can be selected and used for any stencil mask other than that for photo chemical reaction processing in accordance with their usage.

The mask substrate 1 is made of a material which is suitable for wet etching or dry etching. In the embodiment, silicon (Si) is employed since silicon has high reliability as a material used in the semiconductor field and the technique for processing the silicon substrate has already been established. However, the material of the substrate may be selected from among the group of $SiO_2$, ITO, GaAs, InP, Al, $Al_2O_3$, and Cu, which are suitable for dry etching (especially for reactive ion etching) or chemical etching. Also, MgO, $SrTiO_3$, Ni, Nickel Alloy (e.g. SUS314, SUS304), Fe and Cr may be employed for the substrate.

On the mask substrate, the intermediate film 2 and the absorber film 3 as a main film are formed in sequence, which construct a two-layer structure. The intermediate film 2, referred to as a supplemental film, serves for enhancing the adhesion between the substrate 1 and the absorber film 3. For this reason, the intermediate film 2 should have higher adhesiveness than that of the substrate 1 and the absorber film 3.

The intermediate film 2 is used as an etching mask for forming temporary holes 1h on the substrate and as a transferring mask for transferring its pattern onto the absorber film 3. The material for the intermediate film is chosen so that a sufficient etching ratio is ensured between the substrate and the supplemental film. In the embodiment, Cr is used for the intermediate film 2. However, the material may be selected from among the group of Au, Pt, Ni, Mo, Ti, In, $InO_2$, Al, $Al_2O_3$, Aluminum Alloy (Al—Cu), Cu, C, BN, BNC, GaAs, InP, Si compound (such as $SiO_2$, $Si_3N_4$, SiC).

The absorber film 3 is not only either absorptive or reflective for the beams, but also has a self-supporting function so as to reinforcing the tension of the film itself and to prevent the film from being peeled off or loosen. By providing these feature to the main absorber film, a step for separately forming the supportive film can be saved.

As a material for the absorber film 3, Au is employed in the embodiment. However, other than Au, metals, alloys, carbides, nitrides, oxides, borides, semiconductors, or organic substances may be used for the absorber film. More particularly, metals include Pt, W, Ta, Re, Nb, Mo, Ag, In, Sn, Ti, Cu, Ni, Cr, Al and Fe. Alloys include W—Re, Al—Cu, Al—Si—Cu, Ti—W, Pt—Pd, and Nickel alloy (SUS). Carbides include AuC, TaC, $W_2C$ or WC and TiC. Nitrides include TaN, $Ta_3N_5$, WN, TiN. Oxides include $Ta_2O_5$, $WO_3$, $ReO_2$, $TiO_2$, $MoO_2$, $Al_2O_3$, NiO, FeO, $Fe_2O_3$, $Fe_3O_4$, CrO, $Cr_2O_3$ and $CrO_3$. Borides include $TAB_4$. Semiconductors include Si, SiC, $Si_3N_4$, SiN, $SiO_2$, Ge, C, BN, BNC, GaAs, InP. Organic substances include polyimido series resin.

The rear reinforcement film 5 is provided for the purpose of offsetting the stress of the absorber film 3 and preventing the substrate 1 from being bent, whereby the surface of the absorber film 3 is kept flat and even, and precision of the patterning is improved. The rear reinforcement film 5 is preferably made of the same material as the absorber film 3 for simplifying the process, but is not limited to this. The thickness of the rear film 5 is preferably the same as that of the absorber film 3. The rear reinforcement film 5 is used as an etching mask for forming the window 6.

FIGS. 1(a)–1(g) show each of the processes for manufacturing the stencil mask, including steps of forming the intermediate film 2 (referred to as a supplemental film) having a mask pattern, forming the temporary holes 1h, forming the absorber film 3 having a mask pattern, and forming the window 6. In this embodiment, the lift-off technique is used for forming the supplemental film 2.

First, the photoresist film 10 is formed over the surface of the mask substrate 1, as is shown in FIG. 1(a). The mask substrate is a single crystalline Si substrate having a thickness of 400–600 μm. Since, in the embodiment, a focused ion beam (FIB) or electron beam (EB) is used for exposure, electron beam resist is used as a resist film 10, such as, for example, MICROPOSITE-BEAM RESIST SAL601-ER7 (SHIPLEY Inc.). The electron beam resist is coated by spin coating, and is baked. The material of the intermediate film 2 is chosen so that the intermediate film has a sufficient etching selectivity compared to the mask substrate 1, which allows the thickness of the intermediate film 2 and resist film 10 to be made small. The sufficient etching selectivity between the intermediate film 2 and the mask substrate 1 means that the etching rate of the intermediate film 2 is relatively small compared with the substrate 1 under that same etching conditions. In this embodiment, the resist film 10 has a thickness of 12–15 nm which is slightly greater than the thickness of the intermediate film 2.

Then, the resist film 10 is patterned, as is shown in FIG. 1(b) so as to have an inverted pattern compared to the reference mask pattern 4A. The inverted mask pattern is formed by exposing (or etching) the resist film 10 with the FIB or EB technique, then developing and finally rinsing it. Since the thickness t of the photoresist film 10 is very small, the dose amount and the exposure energy can be reduced as well as improving the profile and the focal depth of the photon. This leads to a very minute patterning of the resist film 10, that is, the width p of the inverted pattern of the photoresist film 10 can be very small (for example, 0.1–0.5 μm). The developer is, for example, MICROPOSIT DEVELOPER MF622 manufactured by SHIPLEY Inc. The resist film may be photoresist, X-ray resist, or non-organic resist as well as electron beam resist. Although, in the embodiment, the resist film is a monolayer, a multi-layered resist film may be employed.

Next, as is shown in FIG. 1(c), the intermediate film 2 is deposited on the patterned resist film 10 and the exposed portion of the substrate 1. In the embodiment, the intermediate film 2 corresponds to the supplemental film. The intermediate film 2 is made of Cr and is formed by vapor deposition. The deposition rate of Cr is set to about 0.2 nm/s. The intermediate film may be formed by sputtering. Since a sufficient etching selectivity is ensured between Cr and Si (constituting the substrate), the thickness of the intermediate film can be made small, for example, 10 nm.

Then, in FIG. 1(d), the patterned resist film 10 is removed together with the extra portion of the intermediate film 2 deposited on the resist film. As a result, the pattern of the resist film is inversely transferred onto the intermediate film 2 to form a mask pattern 4A. Thus, the mask pattern 4A is formed on the intermediate film 2 by a lift-off technique. The removal of the resist film 2 is carried out by using a mixed solution of sulfuric acid ($H_2SO_4$) and $H_2O_2$, and then washed by ultrasonic waves for about 90 seconds.

Since the thickness of the intermediate film 2, which is formed by a lift-off technique and serves only as an etching mask, can be made small, the resist film can also be very thin, which allows an accurate inverted pattern and a reduced exposure time.

Next, in the process of FIG. 1(e), the temporary holes 1h are formed on the substrate 1 based on the mask pattern 4A by using the intermediate film 2 as an etching mask. The temporary holes are made for the purpose of storing an extra portion of the absorber film 3 during the forming of the absorber film. Therefore, the depth of the holes is set greater than the thickness of the absorber film.

In this embodiment, the temporary holes are formed by isotropic etching including dry etching and wet etching. More specifically, plasma etching was employed to form the holes 1h under the following conditions: frequency=13.56 MHz, high frequency output=100 W, etching gas=$CF_4$, gas pressure=0.4 torr, substrate temperature=room temperature, etching period =5 minutes. Under these conditions, the etching is proceeding in the depth direction as well as in the lateral direction, and as a result, hemispherical holes are formed. The depth of the holes is, for example, 1.0 μm.

By using isotropic etching, the capacity of the holes 1h is increased in proportion to the proceeding of side etching so that an extra portion of the absorber film 3 can be sufficiently deposited and temporarily stored in it. Thus, the isotropic etching allows a sufficient deposition of the absorber film 3 with the etching amount suppressed. The suppressed etching amount enables the intermediate film 2 to be made thinner, which improves the precision of the mask pattern 4A on the intermediate film. By forming the temporary holes by the isotropic etching, the back-etching amount for forming the window is also reduced, which can shorten the time taken for the window forming process. Furthermore, since the side wall of the holes is hollowed under the supplemental film, the extra portion of the absorber film deposited in the hole is prevented from attaching to the side wall of the holes. As a result, the absorber film formed on the supplemental film is reliably separated from the extra portion of the absorber film deposited in the holes, and a sufficiently thick absorber film is realized.

In the next process shown in FIG. 1(f), the absorber film 3 is formed on the intermediate film 2. An extra portion of the absorber film 3 is deposited through the pattern 4A into the holes 1h and temporarily stored therein. The deposition of the absorber film is controlled so that the deposition is effectively carried out in the direction perpendicular to the substrate 1 (i.e. in the thickness-increasing direction), whereby the mask pattern 4A of the intermediate film 2 is faithfully copied to the absorber film 3 to form an accurate final pattern 4 used for actual processing of the object. With this method, the final pattern 4 is formed in a self-aligning manner in respect to the mask pattern 4A.

In this embodiment, the absorber film 3 is made of Au. Since the absorber film 3 is at least either absorptive or reflective for beams, and is further provided with a self-supporting function, the thickness of the absorber film 3 is set large, for example, 450–600 nm. The Au film is formed by a vapor deposition at a rate of 1.2 nm/s. The smaller the deposition rate is, the more the accuracy of the patterning is increased. The absorber film 3 may have a thickness of up to 1 μm on condition that a firm bonding is not caused between the absorber film 3 formed on the intermediate film 2 and the extra portion deposited in the temporary holes 1h. In other words, it is required that the deposited of the absorber film 3 on the side wall of the intermediate film 2 or on the inner side wall of the holes 1h is avoided so that the extra portion of the absorber film 3 deposited on the bottom of the holes 1h is definitely removed in the later process. Alternatively, the absorber film 3 may be slightly deposited on the side wall of the intermediate film 2 or the inner side wall of the holes 1h on condition that a much thicker absorber film 3 is deposited on the top surface of the intermediate film 2 and the bottom of the holes 1h. In this case, the absorber film 3 deposited on the side wall of the intermediate film 2 is optionally removed in the later process, whereas the extra portion of the absorber film 3 deposited in the holes 1h is definitely removed during the forming of the window 6.

If necessary, the rear reinforcement film 5 may be formed on the rear surface of the substrate 1 for the purpose of offsetting the stress of the absorber film. The rear reinforcement film 5 is preferably made of the same material and the same thickness as the absorber film 3, but is not limited to this. The rear reinforcement film 5 has an opening at a position corresponding to the window 6. The opening may be etched by using an etching mask formed by an ordinary photolithographic process. Alternatively, the rear reinforcement film 5 having an opening may be formed by a lift-off technique. When the stress of the absorber film 3 is small and the warp (or the bending) of the substrate scarcely occurs, it is not necessary to form the rear reinforcement film 5. In this embodiment, the rear reinforcement film is formed after forming the absorber film 3. However, it may be formed before the forming of the intermediate film 2, or between the intermediate film forming step and the absorber film forming step.

Finally, the window 6 is formed as is shown in FIG. 1(g). Prior to the forming of the window, the surfaces of the absorber film 3 and the rear reinforcement fill. 5 may be coated with a protect wax made of an alkali proof tar material or the like, except for the area corresponding to the window 6. Then, the mask substrate 1 is etched by a back etching technique from its rear surface toward the top surface until the window 6 completely penetrates the substrate 1 and communicates with the mask pattern 4. During the forming of the window 6, the holes 1h are destroyed by the removal of the substrate 1, and the extra portion of the absorber film 3 deposited in the holes 1h is naturally removed. Thus, the removal of the extra portion of the absorber film 3 is included in the window forming process, and does not affect the total process for manufacturing the stencil mask. Wet etching using a potassium hydroxide solution at 90°–100° C. is employed for the forming of the window 6.

The protect which has been applied prior to the window etching may be optionally removed after completion of the window 6 by using toluene or xylene as a solvent. However, it may be left without being removed depending on the usage of the stencil mask.

The above described method has the following features and advantages.

First, since the intermediate film 2 functions only as an etching mask for forming temporary holes 1h and a reference mask for forming the absorber film 3, its thickness can be made very small and therefore precise patterning is achieved on this film. The precise mask pattern 4A of the intermediate film 2 is transferred to the absorber film 3 to form a final pattern 4. The absorber film 3 is formed directly based on the precise reference pattern 4A in a self-aligning manner. An extra portion of the absorber film 3 is deposited and temporarily stored in the holes 1h, and later removed during the window forming step.

Second, since the intermediate film 2 does not need to have an absorptive characteristic, a material of the intermediate film 2 and an etching gas or liquid are selected so as to ensure a sufficient etching selectivity with respect to the substrate 1. The sufficient etching selectivity between the intermediate film 2 and the substrate 1 allow the intermediate film 2 to be made even thinner, which improves the patterning accuracy.

Third, because of the small thickness of the intermediate film 2, the reference pattern 4A is accurately formed in a short time. (More particularly, the exposure time for the resist film 10 is shortened.)

Finally, the intermediate film 2 can be left as it is even after forming the holes 1h and the absorber film 3 to constitute a part of the stencil mask. By omitting the intermediate film removing step, the wholes process for manufacturing the stencil mask is simplified.

Second Embodiment

FIGS. 2(a)–2(d) show detailed processes for forming a supplemental (intermediate) film according to the second embodiment. In this embodiment, the supplemental film is formed by a photolithographic process and etching.

Figure 2:
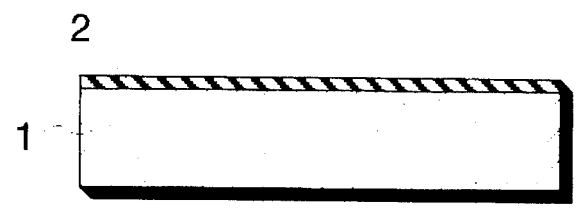
Figure 2:
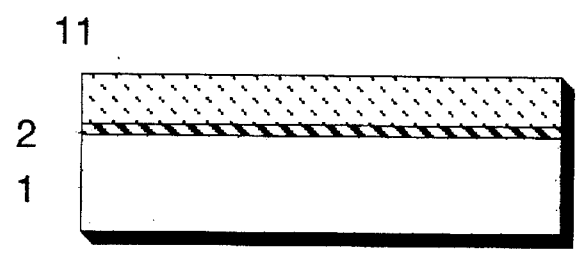
Figure 2:
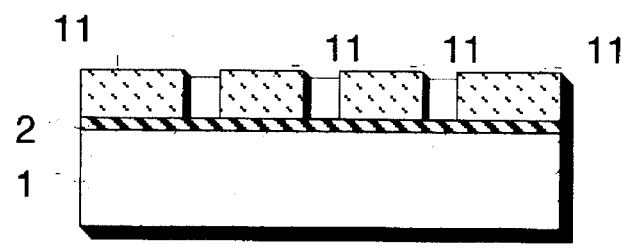
Figure 2:
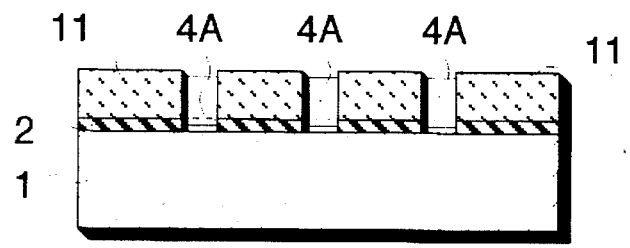

First, as is shown in FIG. 2(a), the intermediate film 2 referred to as a supplementary film is formed on the substrate 1 by sputtering or vapor deposition. Aluminum is used for the intermediate film 2. The thickness of the Al film is set very small, for example, 10 nm.

Then, the resist film 11 is formed over the intermediate film 2, as is shown in FIG. 2(b), by spin coating and baking. Similarly to the first embodiment, electron beam resist is used for the resist film 11.

Next, the resist film 11 is exposed and developed to form a reference pattern, as shown in FIG. 2(c). Similarly to the first embodiment, the FIB or EB technique is employed for exposure, and the same developer is used for development. The resist film 11 serves as an etching mask for patterning the intermediate film 2. The resist film 11 is also formed very thin to improve the accuracy of the patterning.

Finally, the intermediate film is etched based on the reference pattern of the resist film 11 to form a pattern 4A, as shown in FIG. 2(d). The mask pattern 4A is formed by RIE (reactive-ion etching) using chlorine based etching gas ($BCl_3+Cl_2$). The patterning is accurately carried out.

After the patterning of the intermediate film 2, the resist film 11 is removed. Then, the same processes as the first embodiment after the intermediate film forming process are carried out. That is, the temporary holes 1h are formed on the surface of the substrate based on the reference pattern 4A, the absorber film 3 is formed with Au based on the reference pattern 4A, the rear reinforcement film 5 is formed on the rear surface of the substrate 1, and finally the window 6 is formed. These processes are shown in FIGS. 1(e)–1(g), and so omitted from the drawings of the second embodiment.

This embodiment has the following features and advantages.

First, the intermediate film 2 as a supplemental film is patterned by a photolithographic process and etching. By using these techniques, the thickness of the intermediate film 2 and the resist film 11 can be made small. As a result, the accuracy of the reference mask pattern 4A, and naturally that of the final pattern 4, are improved.

Second, since the resist film 11 can be made very thin, the exposure time is shortened.

Third Embodiment

In the third embodiment, the supplemental film and the main film are made of the same material.

FIGS. 3(a)–3(d) show each of the processes of manufacturing the stencil mask according to this embodiment.

Figure 3:
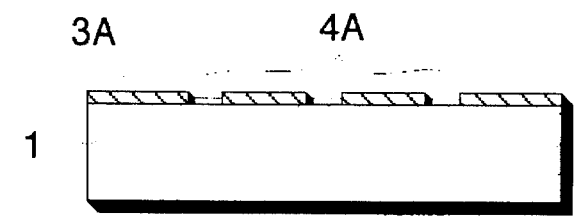
Figure 3:
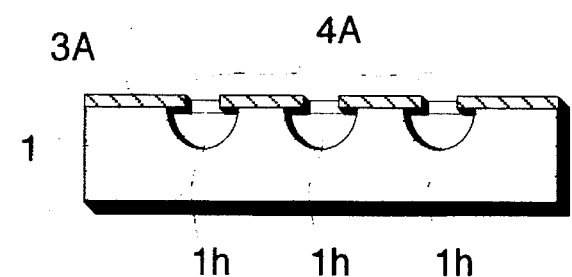
Figure 3:
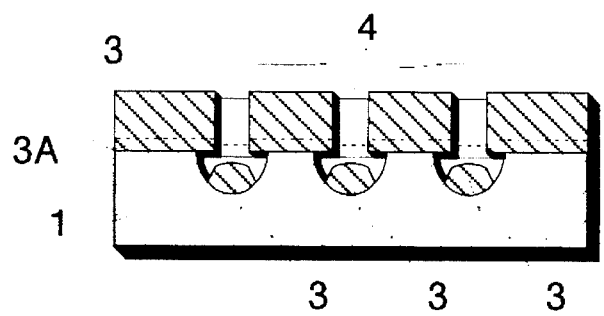
Figure 3:
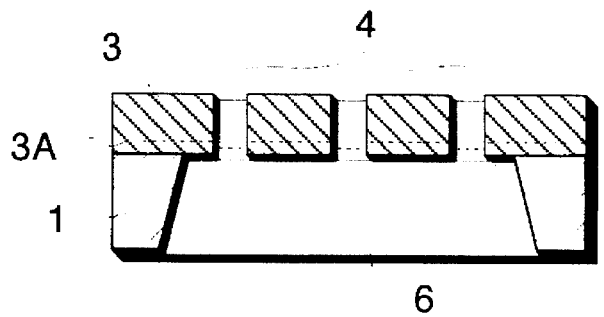

First, the lower absorber film 3A referred to as a supplemental film having a mask pattern 4A is formed on the substrate 1 (FIG. 3(a)). The mask pattern 4A is formed by a lift-off technique used in the first embodiment or by a photolithographic process plus etching used in the second embodiment. The lower absorber film 3A is made of the same material as the absorber film 3 which is formed as a main film. In other words, the lower absorber film 3A serves as an etching mask for forming the holes 1h and a reference mask for the main absorber film 3, and at the same time, serves as a part of the main absorber film 3. The material of the lower absorber film 3A is, for example, Au.

Then, as shown in FIG. 3(b), the temporary holes 1h are formed on the surface of the substrate 1 based on the mask pattern 4A of the lower absorber film 3A.

Next, the absorber film 3 is formed on the lower absorber film 3A, as is shown in FIG. 3(c). An extra portion of the absorber film 3 is deposited in the temporary holes 1h. The reference mask pattern 4A is transferred to the main absorber film 3 to form a final mask pattern 4. The same material (i.e. Au) is used, and the Au film is formed by vapor deposition.

Finally, as shown in FIG. 3(d), the window 6 is formed from the rear surface of the substrate 1 toward the top surface thereof by back etching while removing the temporary holes 1h and the extra portion of the absorber film 3.

In this embodiment, a sufficiently thick substrate 1 is used so as not to be bent or warped. Since the substrate 1 does not harm the flatness and evenness of the absorber film 3, it is not necessary to form the rear reinforcement film 5. Also, the lower absorber film 3A is made of the same material as the main absorber film 3 and serves as a part of the absorber film 3, which realizes a high adhesiveness between the substrate 1 and the absorber film 3. Of course, the same advantages as the first and second embodiments are also obtained.

Fourth Embodiment

In the fourth embodiment, the supplemental film and the main film are made of the same material, and the temporary holes 1h are formed by anisotropic etching.

Figure 4:
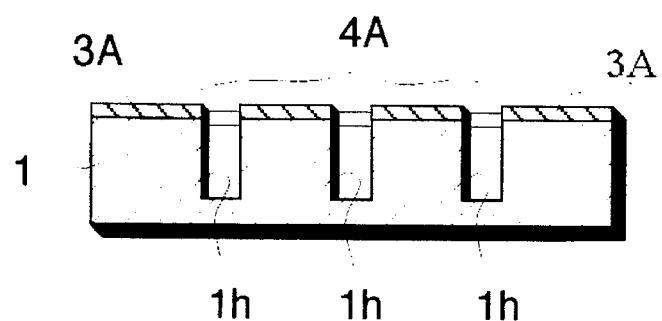
Figure 4:
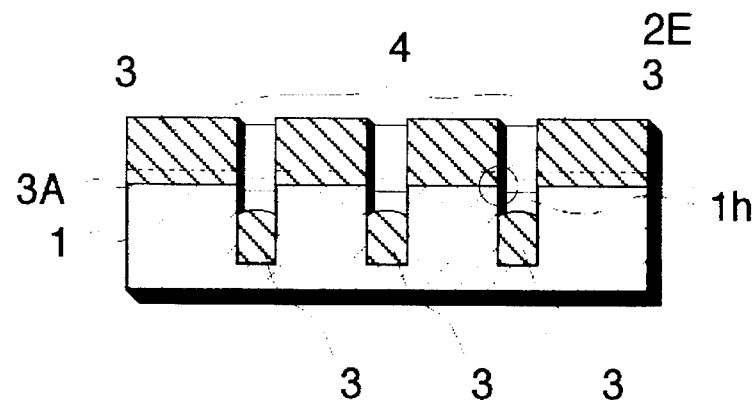

FIGS. 4(a) and 4(b) show each of the process of manufacturing the stencil mask according to this embodiment. Similarly to the third embodiment, the lower absorber film 3A having a mask pattern 4A is formed on the substrate 1. The pattern 4A is formed by a lift-off technique, or by a photolithographic process and etching. The lower absorber film 3A is made of the same material (e.g. Au) as the main absorber film 3.

Then, the holes 1h are formed on the surface of the mask substrate 1 based on the mask pattern 4A of the lower absorber film 3A (FIG. 4(a)), by anisotropic etching such as an RIE technique. The capacity of the holes 1h is controlled by the depth of the holes, and therefore, the depth must be set the same as or greater than the thickness of the absorber film 3. For example, the depth of the holes 1h is 1 μm.

Next, as is shown in FIG. 4(b), the absorber film 3 is formed on the lower absorber film 3A, and an extra portion of the absorber film 3 is deposited through the mask pattern 4A in the holes 1h. The mask pattern 4A of the lower absorber film 3A is transferred to the main absorber film 3 to form a final mask pattern 4. The absorber film 3 is formed by vapor deposition using the same material Au as the lower absorber film.

Finally, similarly to the third embodiment, the window 6 is formed from the rear surface ore the substrate 1 by back etching while removing the holes 1h and the extra portion of the absorber film 3 deposited therein.

This embodiment has the following features and advantages.

First, by using anisotropic etching to form the temporary holes 1h, the etching advances mainly in the depth direction, and hardly any side etching occurs. Thus, the side wall of the temporary holes 1h does not outwardly recede beyond the edge 2E of the mask pattern 4A of the lower absorber film 3A, and therefore, an overhanging portion is not produced at the pattern edge. The edge portion 2E of the pattern 4A of the lower absorber film 3A is supported by the substrate 1 lying thereunder, and the mechanical strength of the edge portion is maintained, which prevents deformation of the mask pattern 4A. Thus, the original accuracy of the mask pattern 4A is maintained and the final mask pattern 4 is formed precisely.

Second, since the deformation of the edge of the mask pattern 4A is prevented, the thickness of the lower absorber film 3A can be made small, which realizes more minute and fine patterning.

Fifth Embodiment

In the fifth embodiment, the supplemental film is used only as an etching mask for forming temporary holes on the substrate, and is removed as the forming of the temporary holes is advanced.

FIGS. 5(a)–5(e) show each of the processes according to this embodiment.

Figure 5:
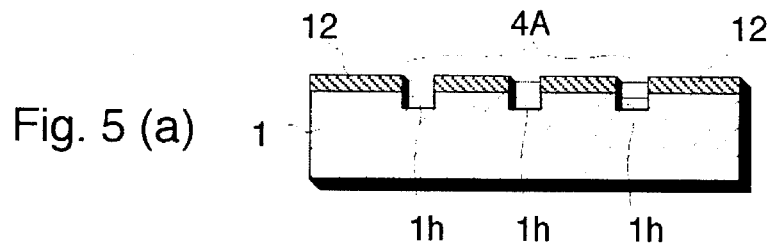
Figure 5:
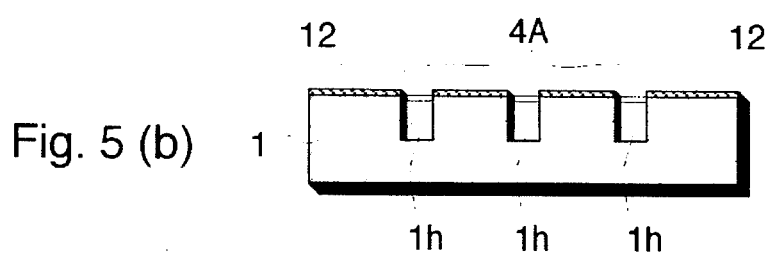
Figure 5:
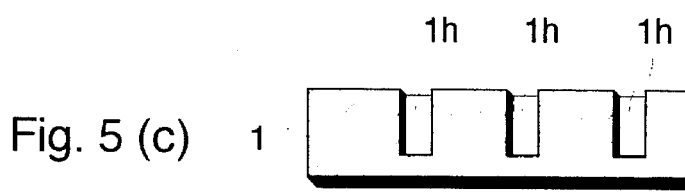
Figure 5:
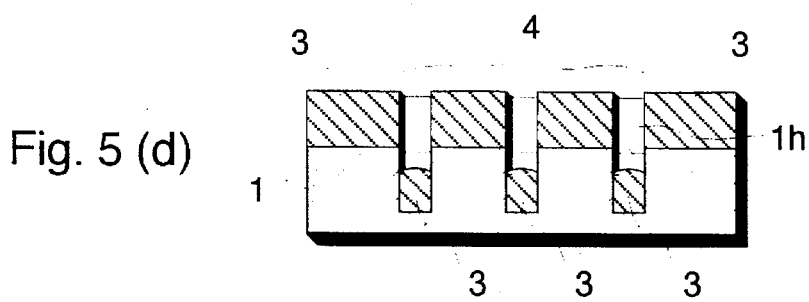
Figure 5:
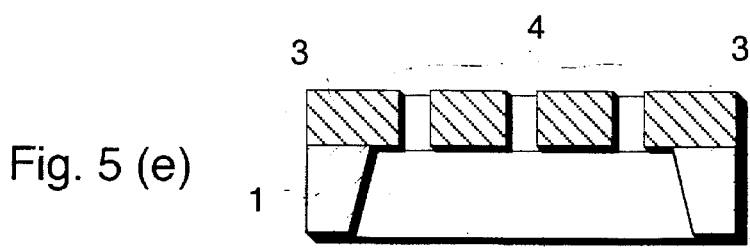

First, as shown in FIG. 5(a), an etching mask 12 having a mask pattern 4A, which is referred to as a supplemental film, is formed on the mask substrate 1. The mask pattern 4A is formed by a lift-off technique, a photolithographic process, or photolithography plus etching. The etching mask 12 is only formed in order to form temporary holes 1h, and is made of the same material as the foregoing intermediate film 2 or the lower absorber film 3A, or of the resist.

Next, the temporary holes 1h are formed on the substrate based on the etching mask 12 by anisotropic etching. As is shown in FIGS. 5(a)–5(c), the thickness of the etching mask 12 decreases as the temporary holes 1h become complete, and when the temporary holes 1h are fully completed, the etching mask 12 is removed.

Then, as shown in FIG. 5(d), the absorber film 3 is formed on the surface of the substrate 1 from which the etching mask 12 has been removed. An extra portion of the absorber film is deposited and stored in the temporary holes 1h. The original mask pattern 4A of the etching mask is transferred to the pattern of the temporary holes, which is then transferred to the final pattern 4 of the absorber film 3. The absorber film 3 is made of, for example, Au, and is formed by vapor deposition.

Finally, as shown in FIG. 5(e), the window 6 is formed from the rear surface of the substrate 1 toward the upper surface by back etching, while removing the temporary holes 1A as well as the extra portion of the absorber film 3 deposited in the holes 1A.

Thus, the etching mask 12 is removed in proportion to the forming of the temporary holes 1A. Since the etching mask 12 exists only until the temporary holes are completed, the thickness of the etching mask 12 can be reduced, which allows the mask pattern 4A to be made more precise. Further, simultaneous processing of the removal of the etching mask 12 and the forming of the temporary holes 1A simplifies all of processes of manufacturing the stencil mask.

Sixth Embodiment

In the sixth embodiment, the supplemental film is a resist film which serves only as an etching mask.

Figure 6:
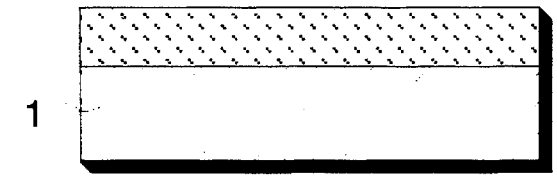
Figure 6:
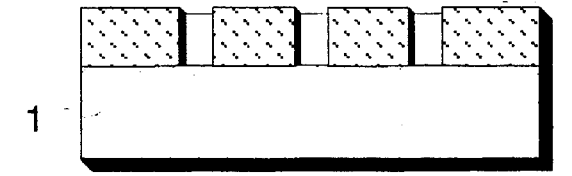
Figure 6:
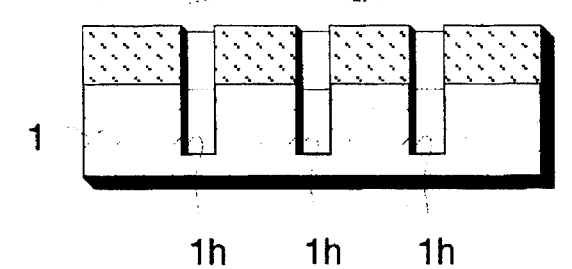
Figure 6:
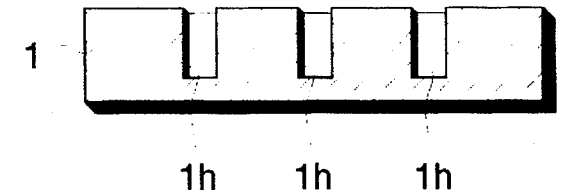
Figure 6:
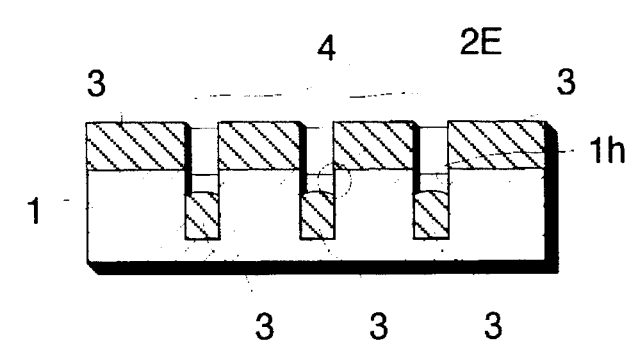

First, as shown in FIG. 6(a), a resist film 13, such as an electron beam resist, is formed as a supplemental film on the surface of the mask substrate 1.

Then, in FIG. 6(b), the resist film 13 is exposed and developed to form an etching mask 13E having a mask pattern 4A. A sufficient etching selectivity is ensured between the etching mask 13E (i.e. electron beam resist) and the substrate 1, and therefore, the thickness of the etching mask 13E can be made small. As a result, the accuracy of the mask patter 4A is improved.

Next, the temporary holes 1h are formed on the substrate 1, as is shown in FIG. 6(c), based on the mask pattern 4A. In this embodiment, anisotropic etching is employed.

Then, the etching mask 13E is removed from the surface of the substrate 1, as shown in FIG. 6(d).

In FIG. 6(e), the absorber film 3 is formed on the substrate 1 from which the etching mask 13E has been removed. An extra portion of the absorber film is deposited in the temporary holes 1h. The mask pattern 4A of the etching mask 13E is transferred to the temporary holes 1h, and then to the absorber film 3 to form a final pattern 4. The absorber film 3 is made of, for example, Au, and is formed by vapor deposition.

After the forming of the absorber film 3, the same process as the fifth embodiment of the window forming is carried out. That is, the window 6 is formed from the rear surface of the substrate 1 by back etching, while removing the holes 1h and the extra portion of the absorber film.

According to this embodiment, the supplemental film is an etching mask 13E formed from the resist film 13. In other words, when the coating, baking, exposure and development of the resist film 13 are sequentially carried out, the resist film itself becomes the etching mask 13E. Since the etching mask 13E is used only for forming the temporary holes 1h, the thickness of the etching mask 13E (resist film 13) can be reduced. The temporary holes 1h are formed directly based on the original mask pattern 4A, which realizes an accurate patterning of the temporary holes.

Moreover, since the supplemental film is itself a resist film 13, the total number of manufacturing processes is reduced compared with the patterning of the supplemental film by a photolithographic process and etching.

If using etching beams, the temporary holes 1h can be directly formed on the substrate 1 without using the etching mask 13 (i.e. without carrying out the etching mask forming step). In this case, a stencil mask is put on the substrate 1 and the surface of the substrate 1 is selectively removed by etching beams. More particularly, photochemical etching or ion milling is used. In the photochemical etching, beams are introduced for enhancing a reaction of light, electron, ion, radical, and so on. In the ion milling, for instance, a focused ion beam is used.

Thus, the etching beams are directly irradiated onto the surface of the substrate 1, and the temporary holes 1h are formed at the exact location irradiated by the beams. The diameter of the beam is faithfully copied to the diameter of the holes, and very precise patterning of the substrate is achieved. This precise patterning is also transferred to the absorber film 3 to accurately form a final pattern 4. By using this method, the temporary holes are directly formed by etching beams, and the etching mask forming step using photolithography and etching is omitted. As a result, the overall process is facilitated and manufacturing time is reduced.

Seventh Embodiment

In the seventh embodiment, some modifications of the stencil mask are shown.

Figure 7:
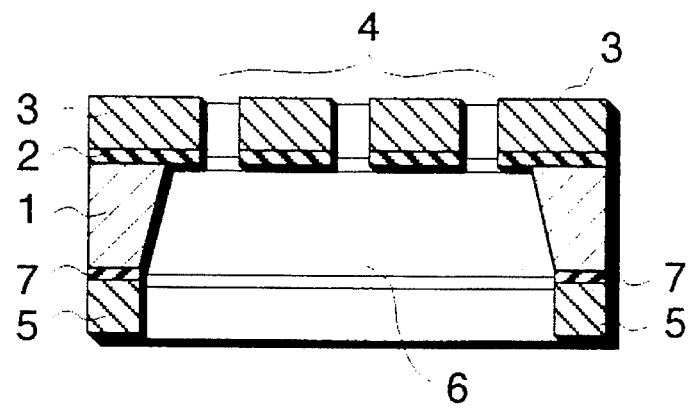
FIG. 7 is a cross-sectional view of the stencil mask manufactured based on the seventh embodiment of the invention.

FIG. 7 shows a cross-sectional view of the stencil mask which modifies the stencil mask of the first and second embodiments. The intermediate film 7 is formed between the rear surface of the substrate 1 and the rear reinforcement film 5.

Figure 8:
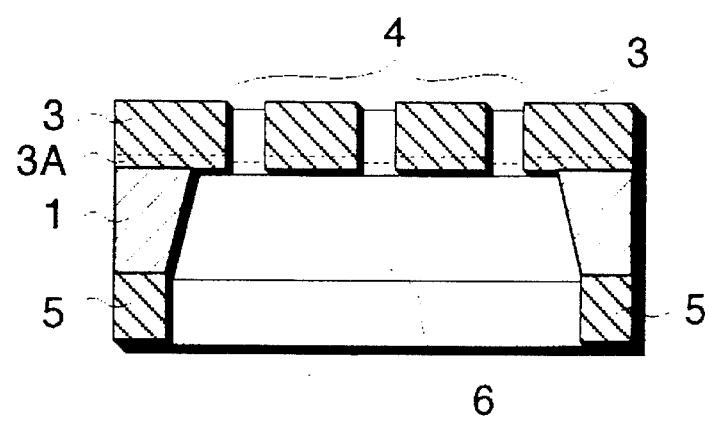
FIG. 8 is an another example of the stencil mask manufactured based on the seventh embodiment.

FIG. 8 shows a cross-sectional view of the stencil mask which is a modification of the third and fourth embodiments. The rear reinforcement film 5 is formed on the rear surface of the substrate 1.

Figure 9:
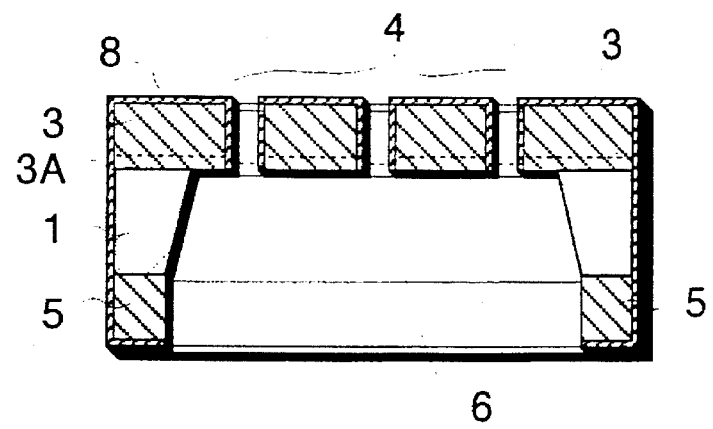
FIG. 9 is a variation of the stencil mask of FIG. 8.

The stencil mask shown in FIG. 9 is a modification of the stencil mask of FIG. 8. The surfaces of the mask substrate 1, absorber film 3 and the rear reinforcement film 5 are all coated with protective wax 8 except for the window forming area.

While the invention has been described with particular reference to the preferred embodiments, it will be understood by those skilled in the art that various changes may be made without departing from the principle and the scope of the invention.

What is claimed is:

1. A method for manufacturing a stencil mask used for a beam process including photochemical etching or deposition, said method comprising the steps of:
   (a) forming a supplemental film having a predetermined mask pattern on an exposed surface of a mask substrate the mask substrate having an exposed surface and a rear surface;
   (b) forming temporary holes on the mask substrate by removing a portion of the mask substrate from the exposed surface toward the rear surface thereof, based on the mask pattern of the supplemental film;
   (c) removing the supplemental film;
   (d) depositing a main film on the exposed surface of the mask substrate and in the temporary holes, said main film being at least either absorptive of or reflective to the beams;
   (e) forming a window penetrating the mask substrate, through which beams pass, by etching the mask substrate from its rear surface at an area corresponding to the mask pattern until the temporary holes are destroyed and the main film deposited in the temporary holes is removed to communicate with the mask pattern.

2. A method according to claim 1, in which the step of forming the supplemental film comprises forming a resist film over the exposed surface of the mask substrate; exposing the resist film at a predetermined mask pattern; developing the exposed resist film; and rinsing of the developed resist film.

3. A method according to claim 1, in which the step of forming temporary holes is carried out by isotropic etching.

4. A method according to claim 1, in which the step of forming temporary holes is carried out by anisotropic etching.

5. A method according to claim 1, the method further comprising a step of forming a rear reinforcement film on the rear surface of the mask substrate for the purpose of offsetting at least an inner stress of the main film, said reinforcement film forming step being inserted between the supplemental film forming step and the window forming step, or between the temporary holes forming step and the window forming step.

6. A method according to claim 1, the method, further comprising a step of forming an intermediate film on the exposed surface of the mask substrate so that adhesiveness to the mask substrate and to the main film is greater than that between the mask substrate and the main film, said intermediate film forming step being inserted after the supplemental film removing step and before the main film forming step.

7. A method according to claim 1, the method further including the steps of forming an intermediate film on the rear surface of the mask substrate and of forming a rear reinforcement film on the intermediate film, are inserted between the main film forming step and the window forming step, or between the temporary holes forming step and the window forming step, said intermediate film having a greater adhesiveness to the substrate and to the reinforcement film than that between the substrate and the reinforcement film.

8. A method according to claim 1, in which said mask substrate is made of a material which allows dry etching or wet etching.

9. A method according to claim 1, in which said mask substrate comprises a material selected from among the group of Si, $SiO_2$, ITO, GaAs, InP, Al, $Al_2O_3$, Cu, MgO, $SrTiO_3$, Ni, Nickel alloy, Fe, and Cr.

10. A method according to claim 1, in which the supplemental film is made of a material having a smaller etching rate than the material of the mask substrate under the same conditions.

11. A method according to claims 1, in which said supplemental film comprises a material selected from among the group of Au, Pt, Ni, Cr, Al, $Al_2O_3$, aluminum alloy, Cu, C, BN (boron nitride), BNC (boron nitrogen carbide), GaAs, InP, and resist.

12. A method according to claim 1, in which said main film comprises of a material selected from among the group of Au, W, Ta, tantalum oxide, tungsten nitride, tantalum nitride, tungsten carbide, tantalum carbide, tungsten boride, and tantalum boride.

13. A method for manufacturing a stencil mask used for a beam process including photochemical etching or deposition, said method comprising the steps of:
   (a) forming a supplemental film having a predetermined mask pattern on an exposed surface of a mask substrate, the mask substrate having an exposed surface and a rear surface;
   (b) forming temporary holes on the mask substrate by removing a portion of the mask substrate from its exposed surface toward the rear surface thereof, based on the mask pattern of the supplemental film, while removing the supplemental film;
   (c) depositing a main film on the exposed surface of the mask substrate and in the temporary holes, said main film being at least either absorptive of or reflective to the beams;
   (d) forming a window penetrating the mask substrate, through which beams pass, by etching the mask substrate from its rear surface at an area corresponding to the mask pattern until the temporary holes are destroyed and the main film deposited in the temporary holes is removed to communicate with the mask pattern.

14. A method according to claim 13, in which the step of forming supplemental film comprises the steps of:

forming a resist film having an inverted mask pattern, said inverted mask pattern having an opening, compared to said mask pattern on the exposed surface of the mask substrate;

depositing the supplemental film on the resist film as well as in the opening of the inverted mask pattern of the resist film; and removing the resist film together with the supplemental film deposited on the surface of the resist film.

15. A method according to claim 13, in which the step of forming the supplemental film comprises the steps of:

forming the supplemental film over the surface of the mask substrate;

forming a resist film over the surface of the supplemental film;

exposing a predetermined mask pattern on the resist film;

developing the exposed resist film to form an etching mask; and etching the supplemental film by using the etching mask to form said predetermined mask pattern on the supplemental film.

16. A method according to claim 13, in which the thickness of the supplemental film is smaller than that of the main film.

17. A method for manufacturing a stencil mask used for a beam process including photochemical etching or deposition, said method comprising the steps of:

(a) forming a supplemental film having a predetermined mask pattern on an exposed surface of a mask substrate, the mask substrate having an exposed surface and a rear surface;

(b) forming temporary holes on the mask substrate by removing a portion of the mask substrate from its exposed surface toward the rear surface thereof, based on the mask pattern of the supplemental film;

(c) depositing a main film on the exposed surface of the supplemental film and in the temporary holes, said main film being at least either absorptive of or reflective to the beams;

(d) forming a window penetrating the mask substrate, through which beams pass, by etching the mask substrate from its rear surface at an area corresponding to the mask pattern until the temporary holes are destroyed and the main film deposited in the temporary holes is removed to communicate with the mask pattern.

18. A method according to claim 17, the method further comprising a step of forming an intermediate film on the surface of the mask substrate so that adhesiveness to the maks substrate and to the supplemental film is greater than that between the mask substrate and the supplemental film, said intermediate film forming step being inserted before the supplemental film forming step.

19. A method according to claim 17, in which said supplemental film is an intermediate film having a greater adhesiveness to the substrate and to the main film than that between the substrate and the main film.

20. A method for manufacturing a stencil mask used for a beam process including photochemical etching or deposition, said method comprising the steps of:

(a) irradiating beams for etching directly onto predetermined areas of an exposed surface of a mask substrate, the mask substrate having an exposed surface and a rear surface, to remove a portion of the mask substrate toward the rear surface in order to form temporary holes on the mask substrate with a predetermined pattern;

(b) depositing a main film on the exposed surface of the mask substrate and in the temporary holes, said main film being at least either absorptive of or reflective to the beams;

(c) forming a window penetrating the mask substrate, through which beams pass, by etching the mask substrate from its rear surface at an area corresponding to the mask pattern until the temporary holes are destroyed and the main film deposited in the temporary holes is removed to communicate with the mask pattern.

21. A method for manufacturing a stencil mask used for a beam process including photochemical etching or deposition, said method comprising the steps of:

(a) forming a supplemental film having a predetermined mask pattern on an exposed surface of a mask substrate, the mask substrate having an exposed surface and a rear surface;

(b) forming temporary holes, each temporary hole having a depth, on the substrate by removing a portion of the substrate from its exposed surface toward the rear surface thereof, based on the mask pattern of the supplemental film;

(c) removing the supplemental film;

(d) depositing a main film having a thickness on the exposed surface of the mask substrate and in the temporary holes, said main film being at least either absorptive of or reflective to the beams;

(e) forming a window penetrating the mask substrate, through which beams pass, by etching the mask substrate from its rear surface at an area corresponding to the mask pattern until the temporary holes are destroyed and the main film deposited in the temporary holes is removed to communicate with the mask pattern, wherein the depth of at least one temporary hole exceeds the thickness of the main film.

22. A method for manufacturing a stencil mask used for a beam process including photochemical etching or deposition, said method comprising the steps of:

(a) forming a supplemental film having a predetermined mask pattern on an exposed surface of a mask substrate, the mask substrate having an exposed surface and a rear surface;

(b) forming temporary holes, each temporary hole having a depth, on the substrate by removing a portion of the substrate from its exposed surface toward the rear surface thereof, based on the mask pattern of the supplemental film, while removing the supplemental film;

(c) depositing a main film having a thickness on the exposed surface of the mask substrate and in the temporary holes, said main film being at least either absorptive of or reflective to the beams;

(d) forming a window penetrating the mask substrate, through which beams pass, by etching the mask substrate from its rear surface at an area corresponding to the mask pattern until the temporary holes are destroyed and the main film deposited in the temporary holes is removed to communicate with the mask pattern, wherein the depth of at least one temporary hole exceeds the thickness of the main film.

23. A method for manufacturing a stencil mask used for a beam process including photochemical etching or deposition, said method comprising the steps of:

(a) forming a supplemental film, the supplemental film having a predetermined mask pattern and a thickness, on an exposed surface of a mask substrate, the mask substrate having an exposed surface and a rear surface;

(b) forming temporary holes, each temporary hole having a depth, on the substrate by removing a portion of the substrate from its exposed surface toward the rear surface thereof, based on the mask pattern of the supplemental film;

(c) depositing a main film having a thickness on the exposed surface of the mask substrate and in the temporary holes, said main film being at least either absorptive of or reflective to the beams;

(d) forming a window penetrating the mask substrate, through which beams pass, by etching the mask substrate from its rear surface at an area corresponding to the mask pattern until the temporary holes are destroyed and the main film deposited in the temporary holes is removed to communicate with the mask pattern, wherein the sum of the depth of at least one temporary hole and the thickness of the supplemental film exceeds the thickness of the main film.

24. A method for manufacturing a stencil mask used for a beam process including photochemical etching or deposition, said method comprising the steps of:

(a) irradiating beams for etching directly onto predetermined areas of an exposed surface of a mask substrate, the mask substrate having an exposed surface and a rear surface, to remove a portion of the mask substrate toward the rear surface in order to form temporary holes, each hole having a depth, on the mask substrate with a predetermined pattern;

(b) depositing a main film having a thickness on the exposed surface of the mask substrate and in the temporary holes, said main film being at least either absorptive of or reflective to the beams;

(c) forming a window penetrating the mask substrate, through which beams pass, by etching the mask substrate from its rear surface at an area corresponding to the mask pattern until the temporary holes are destroyed and the main film deposited in the temporary holes is removed to communicate with the mask pattern, wherein the depth of at least one temporary hole exceeds the thickness of the main film.

* * * * *